US009466709B2

(12) United States Patent
Konstantinov

(10) Patent No.: US 9,466,709 B2
(45) Date of Patent: Oct. 11, 2016

(54) SILICON-CARBIDE TRENCH GATE MOSFETS

(71) Applicant: FAIRCHILD SEMICONDUCTOR CORPORATION, San Jose, CA (US)

(72) Inventor: Andrei Konstantinov, Sollentuna (SE)

(73) Assignee: Fairchild Semiconductor Corporation, San Jose, CA (US)

(*) Notice: Subject to any disclaimer, the term of this patent is extended or adjusted under 35 U.S.C. 154(b) by 0 days.

(21) Appl. No.: 14/744,958

(22) Filed: Jun. 19, 2015

(65) Prior Publication Data

US 2016/0190308 A1 Jun. 30, 2016

Related U.S. Application Data

(60) Provisional application No. 62/096,943, filed on Dec. 26, 2014.

(51) Int. Cl.
| | | |
|---|---|---|
| *H01L 29/78* | (2006.01) | |
| *H01L 29/16* | (2006.01) | |
| *H01L 29/423* | (2006.01) | |
| *H01L 29/10* | (2006.01) | |
| *H01L 29/167* | (2006.01) | |

(52) U.S. Cl.
CPC ....... *H01L 29/7813* (2013.01); *H01L 29/1037* (2013.01); *H01L 29/1095* (2013.01); *H01L 29/167* (2013.01); *H01L 29/1608* (2013.01); *H01L 29/4236* (2013.01)

(58) Field of Classification Search
CPC ........... H01L 29/7927; H01L 29/1608; H01L 29/513
See application file for complete search history.

(56) References Cited

U.S. PATENT DOCUMENTS

| | | |
|---|---|---|
| 5,831,288 A | 11/1998 | Singh et al. |
| 7,989,882 B2 | 8/2011 | Zhang et al. |
| 2010/0193799 A1* | 8/2010 | Nakano et al. ................. 257/77 |
| 2012/0161154 A1* | 6/2012 | Mimura et al. ................. 257/77 |
| 2013/0153999 A1* | 6/2013 | Zhang et al. ................. 257/334 |

OTHER PUBLICATIONS

Furuhashi, Masayuki et al., "Breakthrough in Trade-off between Threshold Voltage and Specific On-Resistance of SiC-MOSFETs", Proceedings of the 25th International Symposium on Power Semiconductor Devices & ICs, pp. 55-58, 2013.
Kimoto, Tsunenobu et al., "Physics of SiC MOS Interface and Development of Trench MOSFETs", pp. 135-138, IEEE 2013.
Yang, Hiroshi et al., "Interface properties in metal-oxide-semiconductor structurs on n-type 4H-SiC(0338)", Applied Physics Letters, vol. 81, No. 25, Dec. 16, 2002, 4 pages.
Tamaso et al.; Ti/Al/Si Ohmic Contacts for Both n-Type and p-Type 4H-SiC; Materials Science Forum vols. 778-780 (2014); pp. 669-672.

* cited by examiner

*Primary Examiner* — Matthew Reames
(74) *Attorney, Agent, or Firm* — Brake Hughes Bellermann LLP

(57) ABSTRACT

In a general aspect, an apparatus can include a semiconductor substrate, a drift region disposed in the semiconductor substrate; a body region disposed in the drift region and a source region disposed in the body region. The apparatus can also include a gate trench disposed in the semiconductor substrate. The apparatus can further include a gate dielectric disposed on a sidewall and a bottom surface of the gate trench, the gate dielectric on the sidewall defining a first interface with the body region and the gate dielectric on the bottom surface defining a second interface with the body region. The apparatus can still further include a gate electrode disposed on the gate dielectric and a lateral channel region disposed in the body region, the lateral channel region being defined along the second interface.

19 Claims, 9 Drawing Sheets

SILICON-CARBIDE TRENCH GATE MOSFETS

CROSS-REFERENCE TO RELATED APPLICATION

This application claims the benefit of and priority to U.S. Provisional Application No. 62/096,943, filed Dec. 26, 2014, entitled "SILICON-CARBIDE TRENCH GATE MOSFETS", the contents of which is hereby incorporated by reference in its entirety.

TECHNICAL FIELD

This description relates to power semiconductor devices. In particular, the description relates to trench gate power metal-oxide-semiconductor field effect transistors that can be implemented in a silicon carbide substrate.

BACKGROUND

The performance of silicon carbide (SiC) power metal-oxide-semiconductor field effect transistor (MOSFETs) can be impacted, as compared with theoretical performance parameters of such devices, due, at least in part, to imperfections of a MOS interface, such as an interface between SiC material and gate a dielectric (e.g., gate oxide), of a MOSFET implemented in SiC. While inversion-layer mobility for lateral crystal faces in SiC devices does not significantly affect performance for a SiC MOSFET (e.g., lateral MOSFET) having a low (e.g., 5 volts) threshold voltage (Vt), devices with such Vt values do not meet the performance and reliability requirements of many power MOSFET application (e.g., operating voltages of 100 V or greater). For example, at such operating voltages, a low Vt device may be normally on, e.g., regardless of applied gate voltage.

However, merely increasing the Vt of such devices may not allow for achieving desired performance parameters due, at least in part, to the fact that inversion-layer mobility in SiC (e.g., in lateral SiC crystal faces) rapidly decreases with increasing Vt, leading to a number of difficult tradeoff decisions when designing SiC power MOSFETs. Such decreases in carrier mobility due to increases in Vt may be due, at least in part, to scattering mobile charge carriers at areas of trapped interface charge.

Vertical SiC crystal faces (e.g., crystal faces 11-20) tend to have better tradeoffs between mobility and Vt. Accordingly, trench gate MOSFETs can benefit from this better Vt tradeoff (e.g., due to having a vertical channel). Unfortunately, trench gate MOSFETs can be difficult to implement in SiC due to other reliability concerns. For instance, electric fields in SiC MOSFETs are on the order of ten times higher than in similar devices in silicon (Si) substrates. These increased electric fields can cause reliability issues in SiC trench gate MOSFETs, such as susceptibility to voltage breakdown damage at the corners of the trench gate (e.g., due to electric field crowding).

SUMMARY

In a general aspect, an apparatus can include a semiconductor substrate of a first conductivity type, a drift region of the first conductivity type disposed in the semiconductor substrate, a body region of a second conductivity type disposed in the drift region and a source region of the first conductivity type disposed in the body region. The apparatus can also include a gate trench disposed in the semiconductor substrate. The gate trench can have a depth that is greater than a depth of the source region and less than a depth of the body region. The apparatus can further include a gate dielectric disposed on a sidewall of the gate trench and a bottom surface of the gate trench. The gate dielectric on the sidewall of the gate trench can define a first interface with the body region and the gate dielectric on the bottom surface of the gate trench can define a second interface with the body region. The apparatus can still further include a gate electrode disposed on the gate dielectric and a lateral channel region of the first conductivity type disposed in the body region, the lateral channel region being defined along the second interface.

Implementations can include one or more of the following features. For instance, the semiconductor substrate can include a silicon carbide semiconductor substrate. The first conductivity type can be n-type and the second conductivity type can be p-type. The lateral channel region can be defined using a nitrogen ion implantation process. The lateral channel region can be further disposed along an interface between the bottom surface of the gate trench and the drift region.

The apparatus can include a sub-contact implant region of the second conductivity type disposed in the body region. The sub-contact implant region can be disposed adjacent to the source region. The source region can be disposed between the sub-contact implant region and the gate trench. The apparatus can include an ohmic contact disposed on at least a portion of the sub-contact implant region and disposed on at least a portion of the source region. The sub-contact region can be defined using an aluminum ion implantation process.

A portion of the gate dielectric can be disposed on a portion of an upper surface of the source region. A portion of the gate electrode can be disposed on the portion of the gate dielectric disposed on the upper surface of the source region.

The apparatus can include a threshold control implant of the second conductivity type disposed in the body region. The threshold control implant can be disposed below the source region and can have a depth that is less than the depth of the body region. The gate dielectric on the sidewall of the gate trench can further define an interface with the threshold control implant. A surface doping concentration of the threshold control implant can be greater than a surface doping concentration of the body region. The sidewall of the gate trench can define an angle of greater than 90 degrees with the bottom surface of the gate trench. The lateral channel region can be further disposed along at least a portion of the first interface. The lateral channel region can terminate at the threshold control implant.

The sidewall of the gate trench can define an angle of greater than 90 degrees with the bottom surface of the gate trench. The lateral channel region can be further disposed along at least a portion of the first interface.

In another general aspect, an apparatus can include a semiconductor substrate of a first conductivity type, a drift region of the first conductivity type disposed in the semiconductor substrate, a body region of a second conductivity type disposed in the drift region and a source region of the first conductivity type disposed in the body region. The apparatus can further include a threshold control implant of the second conductivity type disposed in the body region. The threshold control implant can be disposed below the source region and can have a depth that is less than a depth of the body region. The apparatus can also include a gate trench disposed in the semiconductor substrate. The gate trench can have a depth that is greater than a depth of the threshold control implant and less than a depth of the body region. The apparatus can still further include a gate dielectric disposed on a sidewall of the gate trench and a bottom surface of the gate trench. The gate dielectric on the sidewall of the trench can define an interface with the threshold control implant and a first interface with the drift region. The gate dielectric on the bottom surface of the trench can define a second interface with the drift region. The apparatus can also further include a gate electrode disposed on the gate dielectric and a lateral channel region of the first conductivity type disposed in the body region, the lateral channel region being defined along the second interface. The sidewall of the gate trench can be spaced a first distance from the body region. The first distance can be less than or equal to a second distance. The second distance can be a lateral width from a vertical edge of the body region to a vertical edge of a zero-bias depletion region of the apparatus.

Implementations can include one or more of the following features. For instance, the semiconductor substrate can include a silicon carbide semiconductor substrate. A surface doping concentration of the threshold control implant can be greater than a surface doping concentration of the body region.

The apparatus can include a sub-contact implant region of the second conductivity type disposed in the body region. The sub-contact implant region can be disposed adjacent to the source region. The source region can be disposed between the sub-contact implant region and the gate trench. The apparatus can include an ohmic contact disposed on at least a portion of the sub-contact implant region and disposed on at least a portion of the source region.

In another general aspect, an apparatus can include a silicon carbide (SiC) substrate of a first conductivity type, a drift region of the first conductivity type disposed in the SiC substrate, a body region of a second conductivity type disposed in the drift region and a source region of the first conductivity type disposed in the body region. The apparatus can also include a gate trench disposed in the SiC substrate. The gate trench can have a depth that is greater than a depth of the source region and less than a depth of the body region. The apparatus can further include a gate dielectric disposed on a sidewall of the gate trench and a bottom surface of the gate trench. The gate dielectric on the sidewall of the gate trench can define a first interface with the body region. The gate dielectric on the bottom surface of the gate trench can define a second interface with the body region. The sidewall of the gate trench can define an angle of greater than 90 degrees with the bottom surface of the gate trench. The apparatus can still also include a gate electrode disposed on the gate dielectric and a lateral channel region of the first conductivity type disposed in the body region, the lateral channel region being defined along the second interface with the body region.

Implementations can include one or more of the following features. For instance, the apparatus can include a threshold control implant of the second conductivity type disposed in the body region. The threshold control implant can be disposed below the source region and can have a depth that is less than the depth of the body region. The gate dielectric on the sidewall of the gate trench can define an interface with the threshold control implant. The lateral channel region can be disposed along at least a portion of the first interface with the body region. The lateral channel region can terminate at the threshold control implant.

The lateral channel region can be disposed along at least a portion of the first interface with the body region.

DETAILED DESCRIPTION

Figure 1:
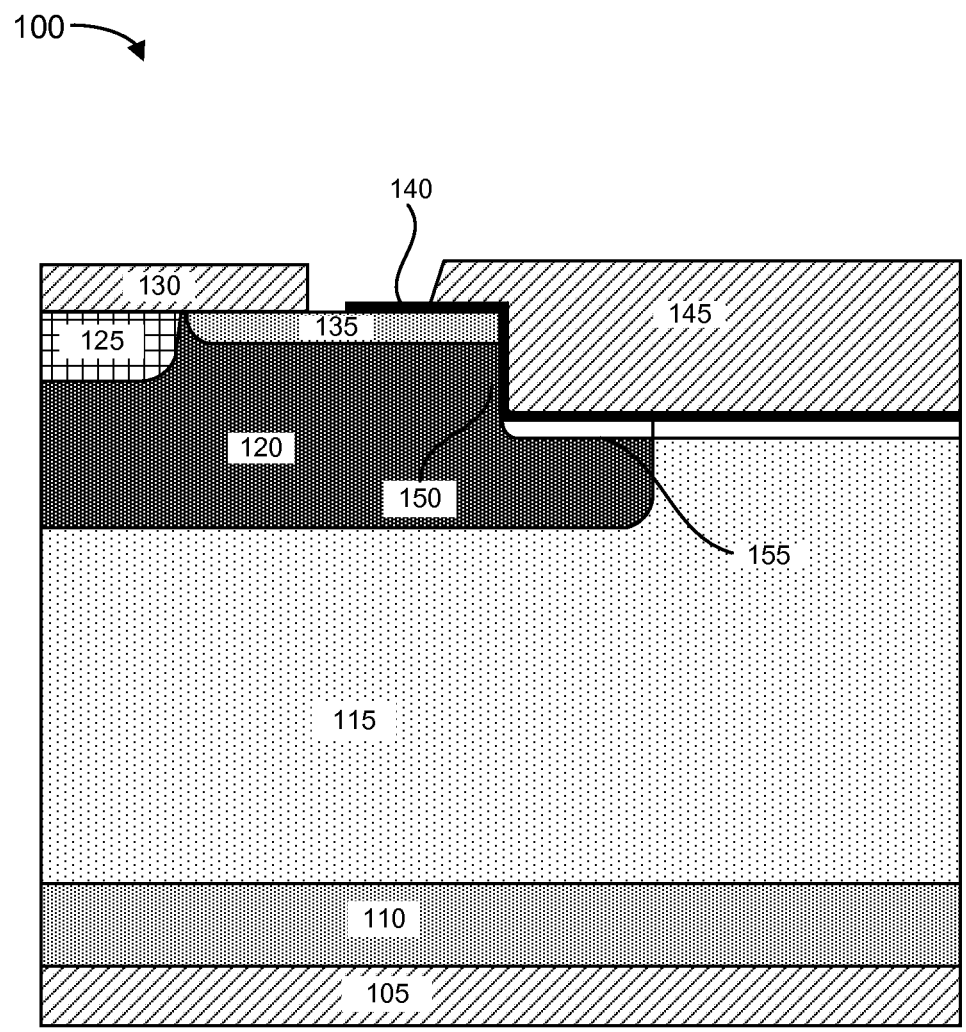
FIG. 1 is a cross-sectional diagram illustrating a silicon-carbide (SiC) trench gate power metal-oxide-semiconductor field effect transistor (MOSFET), according to an implementation.

Due to the electrical characteristics of SiC, it is desirable to produce power switches, such as MOSFET power switches, in SiC. However, as noted above, inversion-layer mobility in SiC is a strong function of Vt, especially for lateral SiC crystal faces. Accordingly, lateral SiC MOSFETS with a Vt that is suitable for use as a power switch (e.g., Vt above 5 Volts) tend to have very low inversion-layer mobility and, therefore, can have poor performance characteristics, such as high drain-to-source on-resistance (Rdson).

As an example, mobility for a planar (0001) Si-face in SiC can have channel carrier (e.g., electron) mobility below 5-10 cm2/Vs. In comparison, if the a-plane (1-100) face of SiC is used for a MOSFET channel, the inversion-layer electron mobility is 4 to 5 times higher than that for the Si-face for the same p-type doping and the same threshold voltage Vt. This improved vertical carrier mobility can be advantageous in a trench gate MOSFET design implemented in SiC. However, SiC trench gate MOSFET devices can have reliability concerns, such as those discussed herein.

Various implementations of SiC trench gate power MOSFETs are illustrated in the attached drawings and described in the following discussion. In the illustrated implementations, the devices are illustrated as "half cells", where a "full cell" can be produced using two half cells, where one half cell is a mirror image of the other. Larger SiC trench gate MOSFETs can be produced using multiple full cells in combination. Accordingly, the half cells shown in the drawings and described herein are given by way of example and for purposes of illustration. That is, a SiC trench gate MOSFET device of a desired size can be produced using an appropriate number of half cells (and their mirror images) to produce a device of a desired size.

The SiC trench gate MOSFETs described herein can address, at least in part, the issues discussed above (e.g., carrier mobility to Vt tradeoff and reliability issues). In these implementations, a SiC trench gate MOSFET can include a vertical, normally off inversion channel (e.g., along a gate trench sidewall) and a self-aligned (e.g., implanted) lateral MOS channel. In such implementations, the lateral MOS channel may have a lower Vt than the vertical channel, or can be normally on (e.g., regardless of gate electrode bias).

In such implementations, doping in the lateral MOS channel can be achieved using ion implantation, where that ion implantation is done using an implantation beam that is normal or at a near-normal angle to the surface of the device. As is described herein (and shown in the drawings), this allows the lateral channel structure to be a "self-aligned" structure, which can allow for achieving very short channel lengths without having to perform submicron patterning to form the lateral MOS channel.

One benefit of such trench gate devices, as compared to lateral devices, is lower channel on-state resistance (Rdson) due to taking advantage of a better tradeoff between electron mobility and threshold voltage in the vertical channel. In such approaches, the inversion channel can be very short, for example between 50 nanometers (nm) and 500 nm, which can further improve (e.g., reduce) Rdson.

One reason why such SiC MOSFET devices can have advantages over conventional designs is due, at least in part, to properties of the inversion channel mobility in 4H SiC. Namely, (i) mobility rapidly decreases with increasing threshold voltage (Vt); and (ii) mobility along the trench sidewalls is much higher than the in-plane mobility for a same Vt. Such SiC MOSFET devices, e.g., those described herein, therefore, can have lower Rdson as compared to conventional SiC MOSFET devices.

FIG. 1 is a cross-sectional diagram illustrating a silicon-carbide (SiC) trench gate power metal-oxide-semiconductor field effect transistor (MOSFET) device 100, according to an implementation. The device 100 in FIG. 1 is an n-channel SiC trench gate FET with a vertical-inversion channel and a self-aligned, an n-doped lateral channel portion (lateral channel region, etc.). In other implementations, a p-channel device could be produced using similar approaches to those described herein. Likewise, P-channel devices similar to those illustrated in the other drawings can also be produced.

Figure 2:
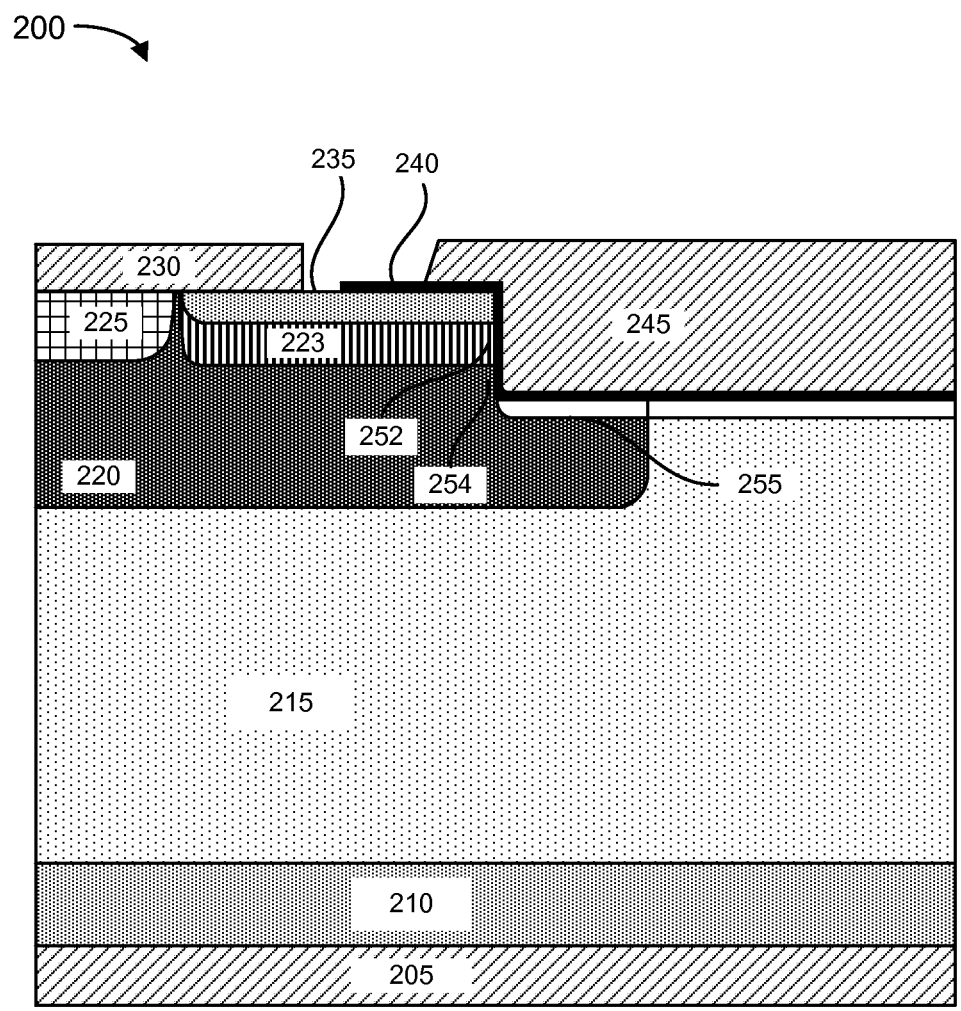
FIG. 2 is a cross-sectional diagram illustrating another SiC trench gate power MOSFET, according to an implementation.

As with each of the device implementations illustrated herein, the device 100 in FIG. 1 can include a backside drain contact 105, a heavily doped n-type (n+) substrate 110, an n-type (e.g., lightly doped) drift region 115, a p-type body region 120, a sub-contact p-type implant 125 (for forming an ohmic contact), a source and body contact 130 (ohmic contact), an n-type (n+) source region 135, a gate dielectric 140 and a gate electrode 145. For brevity, each of these elements is not discussed with respect to each of the illustrated implementations. Analogous (corresponding, etc.) features in FIG. 2 are referenced with like 200 series reference numbers, in FIGS. 3A-3F with like 300 series reference numbers and in FIG. 4 with like 400 series reference numbers. Further, in FIGS. 3A-3F, for purpose of clarity, the substrate and ohmic contact 130 to the source region 135 and the body region 120 (including the sub-contact implant 125) are not illustrated. Further in FIGS. 3A-3F, certain references numbers are not repeated in the various views.

The device 100 of FIG. 1 can overcome reliability concerns associated with voltage breakdown related damage occurring at the corner of a gate trench, as the gate trench corner is located within the p-type body region 120 (which can also be referred to as a p-type depletion stopper). This provides shielding (from the drift region 115) for the trench corner, which reduces field crowding at the trench corner, thus reducing the risk of voltage breakdown related damage.

In the device of FIG. 1 (and other devices described herein), the inversion layer of the device conduction channel consists of, at least, two portions (sections). For instance, the inversion layer of the device conduction channel (channel) can include a vertical portion 150 along the vertical sidewall of the gate trench and below the n+ source region 135. This vertical portion 150 of the channel can have a high Vt (e.g., >5 volts) and also have high carrier mobility, due to higher carrier mobility in vertical SiC crystal faces.

The channel of the device 100 in FIG. 1 can also include a lateral portion (or region) 155 (e.g., with low carrier mobility). The lateral portion 155 of the channel of the device 100 in FIG. 1 can be defined along an interface of the lateral portion of the gate dielectric 140 with the p-body region 120 (e.g., along a portion of the bottom of the gate trench). Carrier mobility in this lateral portion 155 of the channel can be improved by decreasing a Vt of the lateral portion 155, so as to increase channel carrier mobility within the lateral portion 155 of the channel. Such a reduction in Vt can be achieved using ion implantation to define the lateral portion 155 as an n-doped portion along the lateral surface of p-body region 120 and the drift region 115 that is disposed below the lateral portion of the gate dielectric 140 (e.g., below the gate trench), as is shown in FIG. 1. Such an approach is further described with respect to FIG. 3D. Depending on the particular implementation, the n-doped lateral portion 155 (e.g., created by ion implantation) can extend completely across the interface between a bottom surface of the gate trench and the drift region 115 or can terminate within the drift region 115, e.g., at some predetermined distance from the edge of the p-type body region 120.

Depending on the implementation, the lateral portion 155 of the channel can have a lower Vt than the vertical portion 150 of the channel, or can be normally on (e.g., regardless of a bias on gate electrode 145 within normal operating conditions). Such an arrangement for a SiC power MOSFET device can have a lower Rdson than a lateral SiC power MOSFET device, where its lateral channel has a high Vt and associated low channel carrier mobility.

FIG. 2 is a cross-sectional diagram illustrating another SiC trench gate power MOSFET device 200, according to an implementation. As compared with the device 100 illustrated in FIG. 1, the device 200 shown in FIG. 2 can be implemented with a conduction channel that has, at least, three portions. Briefly, as with the device 100 illustrated in FIG. 1, the device 200 shown in FIG. 2 can include a backside drain contact 205, a heavily doped n-type (n+) substrate 210, an n-type (e.g., lightly doped) drift region 215, a p-type body region 220, a sub-contact p-type implant 225 (for forming an ohmic contact), a source and body contact 230 (ohmic contact), an n-type (n+) source region 235, a gate dielectric 240 and a gate electrode 245. For brevity, as noted above, each of these elements may not be specifically discussed with respect to the device 200 of FIG. 2.

A channel of the device 200 of FIG. 2 can include a lateral channel portion (lateral portion, lateral channel region, lateral region, etc.) 255 that is similar to the lateral channel portion 155 of the device shown in FIG. 1 and described above. In contrast with the device 110 shown in the FIG. 1, a channel of the device 200 can include a vertical portion that has more than one region. For instance, the vertical portion of the channel of the device 200 can include a first region 252 having a highest threshold of the three portions of the channel (e.g., two vertical portions and the lateral portion 255) shown in FIG. 2. The first region 252 of the vertical portion of the channel can be defined by a shallow implant 223 (p-body 2) that has a higher surface doping concentration than the p-body region 220 (e.g., such as the p-body region 120 of the device 100 shown in FIG. 1). The doping concentration of the implant 223 can be used adjust (control) a threshold voltage (Vt) of the device 200. Accordingly, according the implant 223 can be referred to as a threshold control implant 223.

The vertical portion of the channel of the device in FIG. 2 can also include a second region 254 that is defined by the p-body region 220 (which has a lower acceptor doping concentration than the p-body 2 region 223) and the vertical portion of the gate trench that is disposed below the p-body 2 region 223. In the device 200 of FIG. 2, a Vt of the device 200 can be controlled by (established by) the p-body 2 implant region 223, e.g., based on a doping concentration of the p-body 2 implant region 223. Such an approach may allow for producing a SiC power MOSFET device with a very short effective channel length, for example, between approximately 50 nm and 500 nm.

FIGS. 3A-3F are cross-sectional diagrams illustrating a semiconductor process flow for producing a SiC trench gate power MOSFET device 300, according to an implementation. The semiconductor processing operations of FIGS. 3A-3F are shown in schematic form. It is noted that the specifics of a given semiconductor process operation can vary depending on the particular device being implemented and/or on the specific semiconductor process that is used to produce a given SiC trench gate power MOSFET device.

FIGS. 3A-3F illustrate a semiconductor process flow for producing a SiC trench gate power MOSFET device 300 that includes an inclined gate trench sidewall. In such implementations, at least a part of a vertical (inclined) portion of the channel, as well as a lateral portion of the channel are implanted with donors (e.g., to create an n-doped portion of the channel). However, in such approaches, the lateral portion of the channel can receive a higher dose than the gate trench sidewall, due to the inclination of the sidewall resulting in attenuation of the implant beam. Depending on the implementation, the gate trench sidewall can have an angle (e.g., from vertical) that is greater than 40 degrees (e.g., an angle of greater than 90 degrees with a bottom surface of the gate trench). In some implementations, the central part of the n-region along the gate trench bottom and over the drift region can be masked, so as not to receive the donor (n-type) channel implant. Such an approach can reduce the peak electric field in the drift region and reduce risk of damage due to voltage breakdown.

Figure 3A:
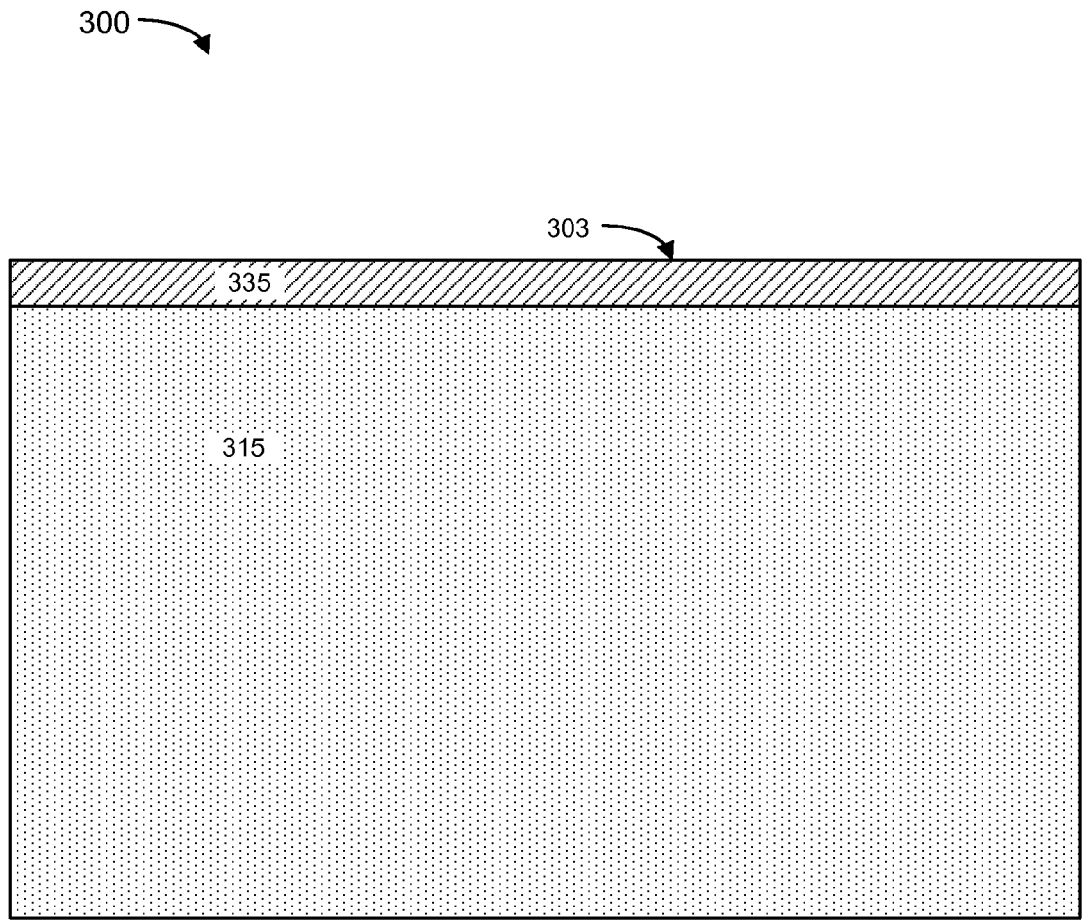
FIGS. 3A-3F are cross-sectional diagrams illustrating a semiconductor process flow for producing a SiC trench gate power MOSFET, according to an implementation.
Figure 3B:
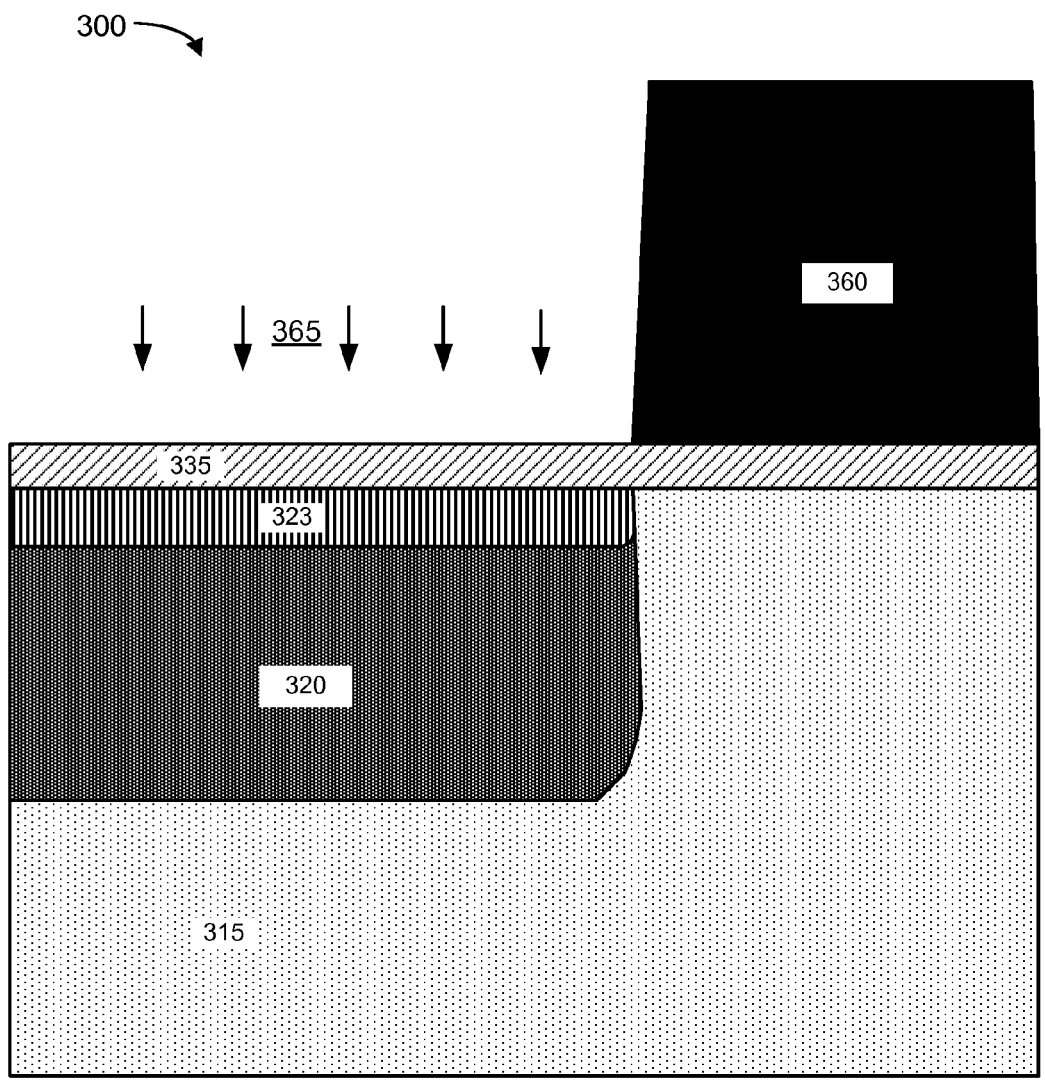

In FIG. 3A, a starting material 303 is illustrated. The starting material 303 can be an epitaxial SiC wafer (e.g., n-type in this example) that includes a drift region 315 (n-type drift region) and an n+ source layer 335. Depending on the particular approach, the n+ source layer 335, rather than being epitaxially formed, can be formed using ion implantation. As shown in FIG. 3B, a mask 360 can be formed and a deep p-body region 320 (p-type shielding body), as defined by the mask 360, can be formed in the starting material 303. The p-body region 320 can be formed using ion implantation 365 (e.g., such as by implanting aluminum (Al) ions). As also illustrated in FIG. 3B, a p-body 2 region 323 (with a higher doping concentration (e.g., surface doping concentration) than a doping concentration (e.g., surface doping concentration) of the p-body region 320) can also be formed using the same mask 360.

Figure 3C:
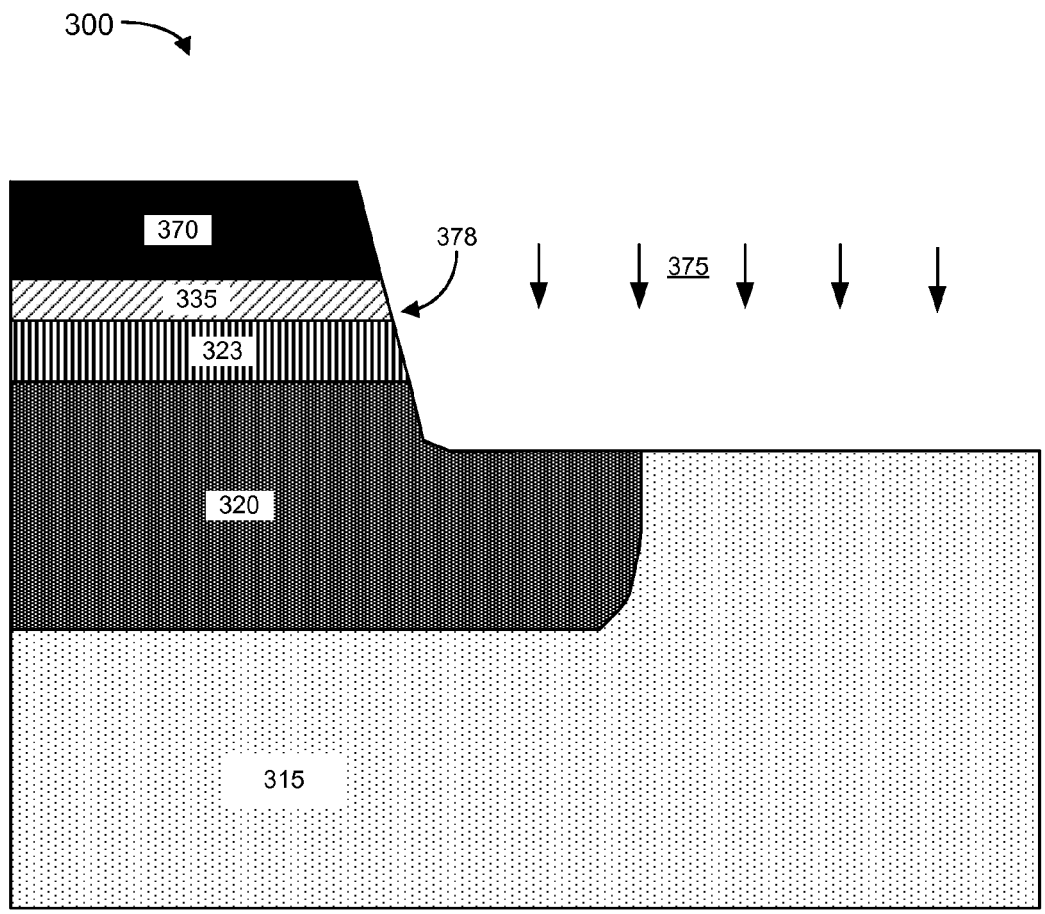

As shown in FIG. 3C, the mask 360 of FIG. 3B can be removed and an oxide mask 370 can be formed on the n+ source region 335. A mesa etch 375 can then be performed to produce an inclined gate trench sidewall 378, as shown in FIG. 3C. After performing the mesa etch 375, a high temperature anneal for implanted dopant activation (e.g., at a temperature of greater than 1500° C.) can be performed to activate the dopants from implanted and/or included in epitaxial formed layers in previous processing operations, which can also repair damage (e.g., implant and/or etch damage) to the SiC structure.

Figure 3D:
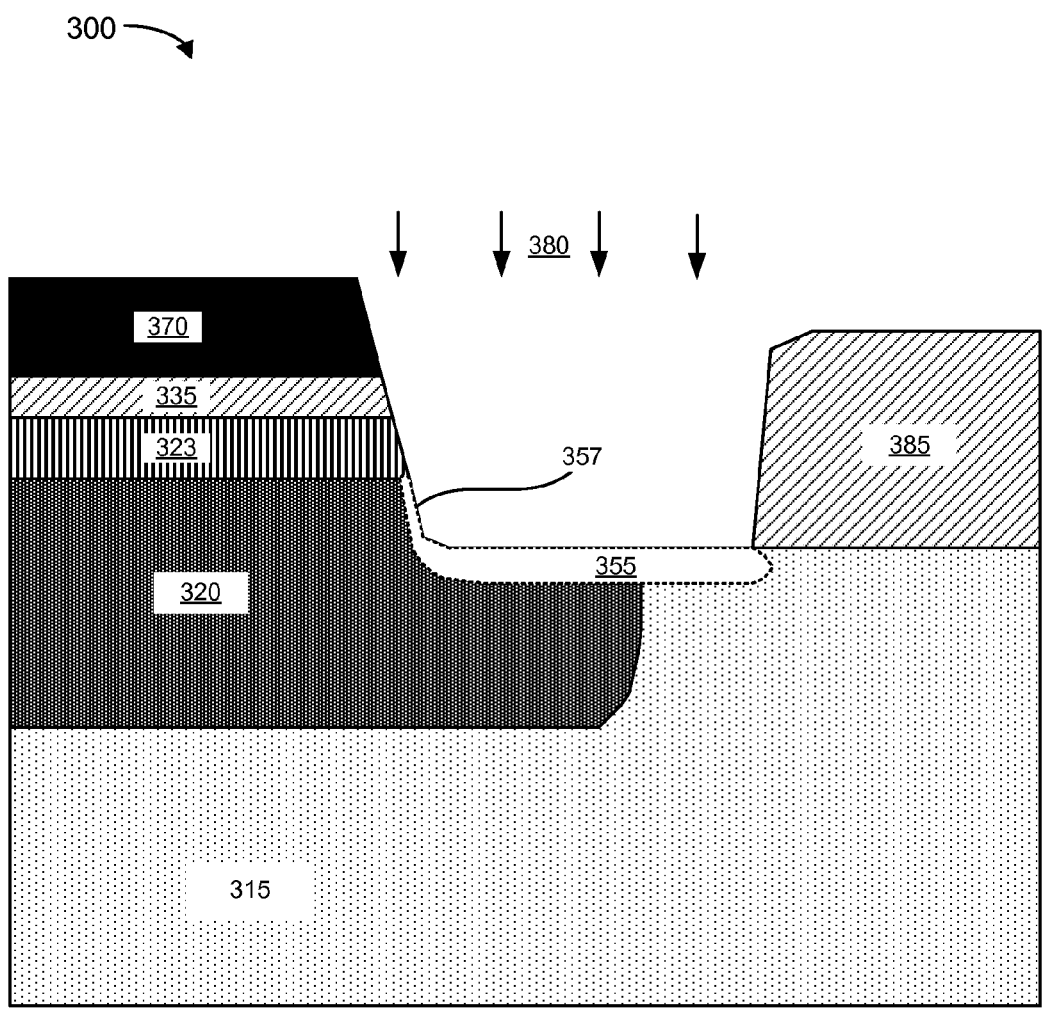

As illustrated in FIG. 3D, a nitrogen ion implant 380 can then be performed. The implant 380 can be done with a low dopant dose (e.g., a dose below $1e^{13}/cm^2$). The implant 380 can lower a Vt in the lateral channel portion (and in the implanted portion of the inclined gate trench sidewall). As discussed above, a mask 385 (e.g., a resist mask) can be used to prevent the nitrogen implant 380 from being performed in the center of the drift region 315 (e.g., of a full cell). As previously discussed, such an approach may reduce the peak electric field in this portion of the drift region 315, which can reduce the risk of damage due to breakdown (e.g., under reverse-bias conditions). For instance, the regions in the center of a vertical JFET channel (in a so-called JFET region, e.g., the area of the drift region 315 between p-body regions 320 in a full cell) can be exposed to high electric field under reverse-bias conditions, even in spite of the shielding regions of the p-implant. In some implementations, it can be desirable that a lateral extension defined by the nitrogen implant 380 in the JFET region does not exceed approximately one-sixth ($\frac{1}{6}^{th}$) of the JFET region width from each side (e.g., edge of the p-body regions 320 in a full-cell).

Figure 3E:
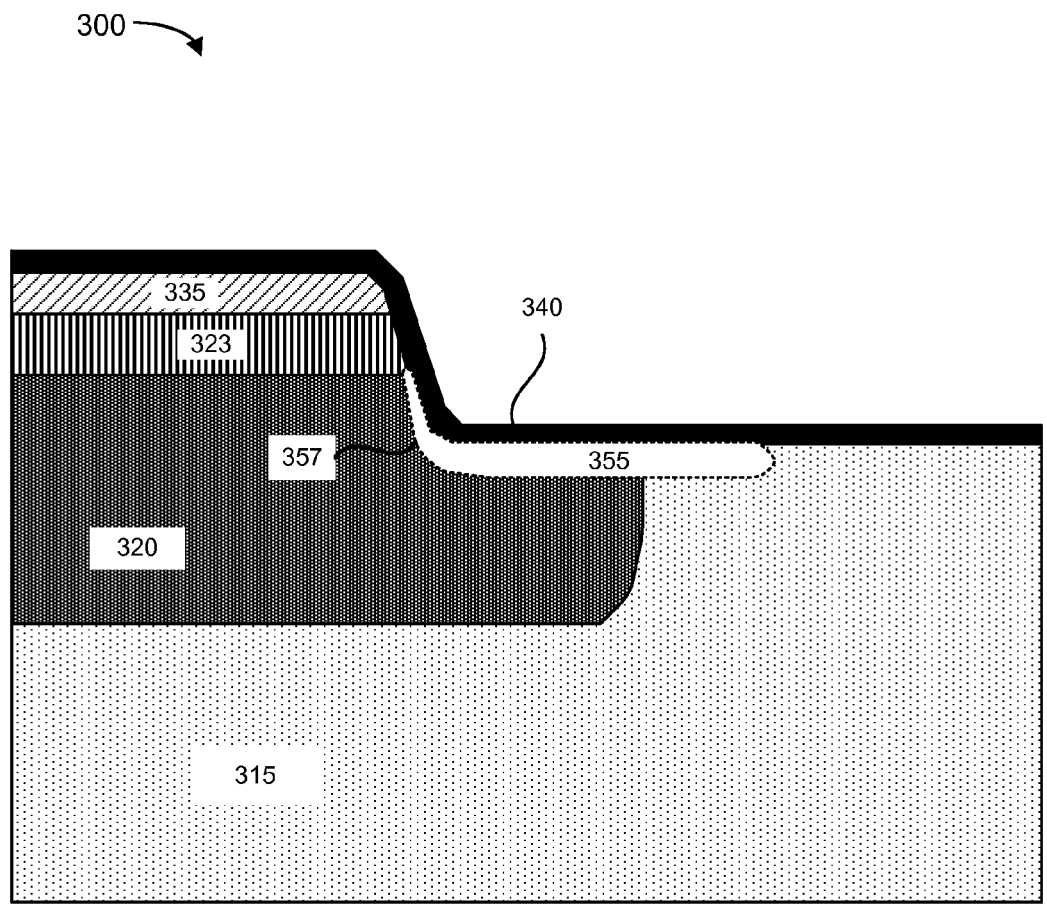
Figure 3F:
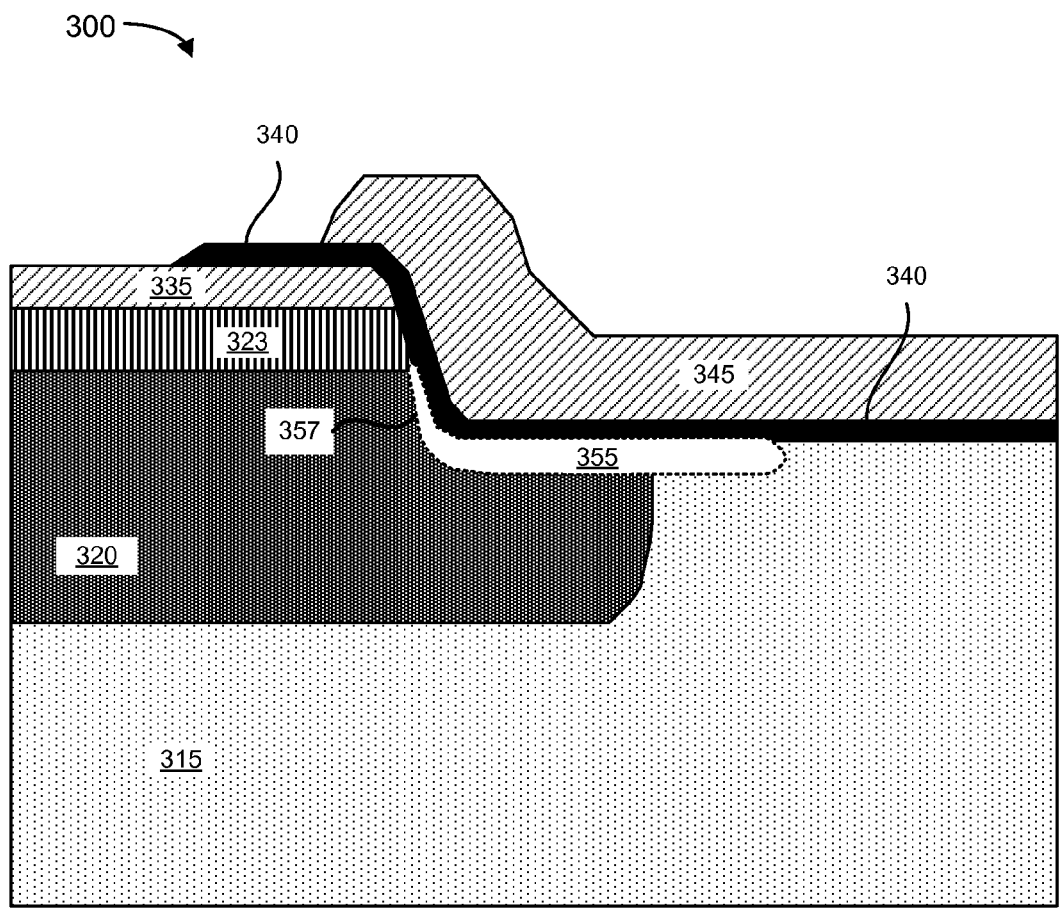

As illustrated in FIG. 3E, an oxide layer can be grown or deposited to form a gate dielectric 340. In an implementation, forming the gate dielectric 340 can include a performing an $N_2O$ or NO treatment, which can decrease a density of interface states. Such an $N_2O$ or NO treatment can activate the nitrogen donors implanted during the nitrogen implant 380 processing operation illustrated in FIG. 3D. As shown in FIG. 3F, a polysilicon gate electrode 345 can be formed on the gate dielectric 340. Other elements of the device 300 of FIG. 3F (e.g., elements of the devices 100 and 200 not shown in FIGS. 3A-3F) can be formed in other processing operations, such elements can include a p-type sub-contact region and a source and body ohmic contact. The device 300, as shown FIG. 3F, can also include a substrate and a drain contact (both not shown), such as in the devices 100, 200 and 400 of FIGS. 1, 2 and 4.

Figure 4:
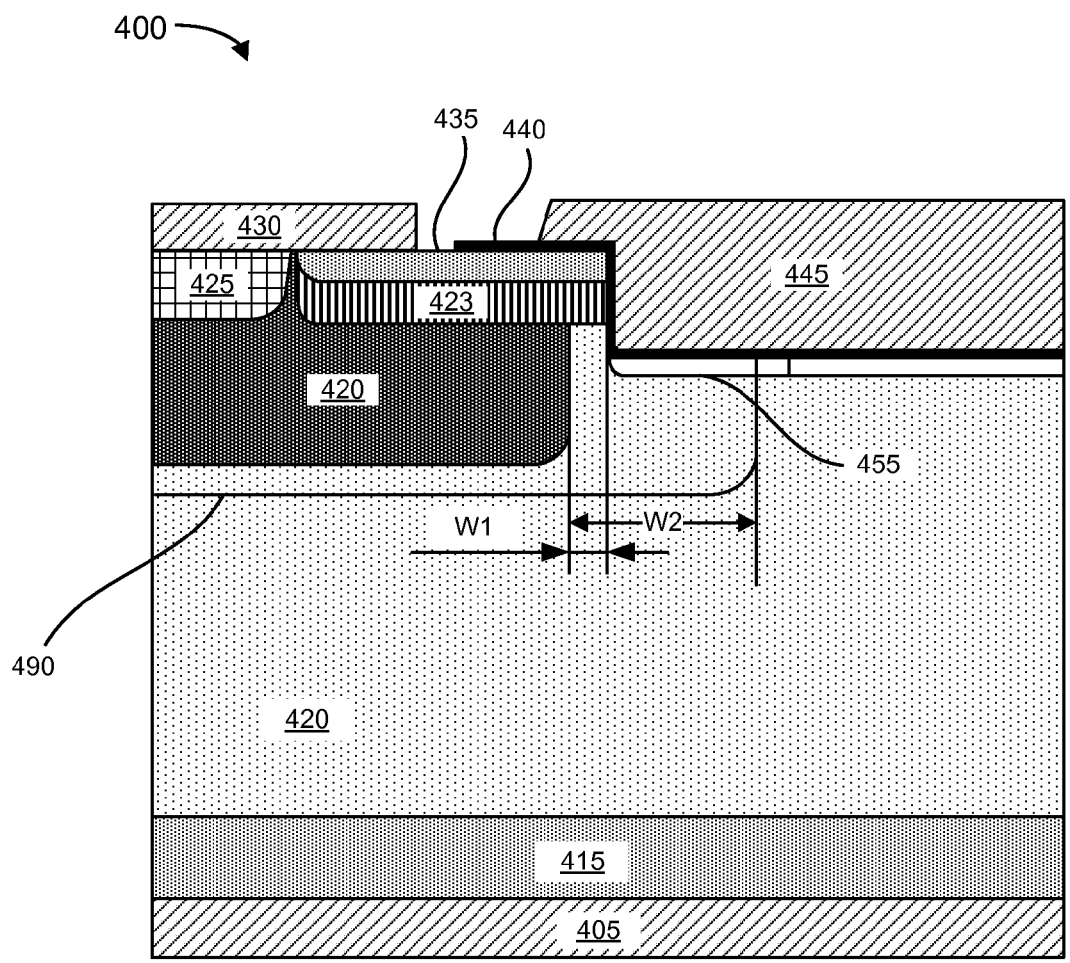
FIG. 4 is a cross-sectional diagram illustrating yet another SiC trench gate power MOSFET, according to an implementation.

FIG. 4 is a cross-sectional diagram illustrating yet another SiC trench gate power MOSFET device 400, according to an implementation. Briefly, as with the devices 100 and 200 illustrated in FIGS. 1 and 2, respectively, the device 400 shown in FIG. 4 can include a backside drain contact 405, a heavily doped n-type (n+) substrate 410, an n-type (e.g., lightly doped) drift region 415, a p-type body region 420, a sub-contact p-type implant 425 (for forming an ohmic contact), a source and body contact 430 (ohmic contact), an n-type (n+) source region 435, a gate dielectric 440 and a gate electrode 445. For brevity, as noted above, each of these elements may not be specifically discussed again with respect to the device 400 of FIG. 4.

As shown in FIG. 4, in this implementation, the shielding p-body region 420 is spaced from a vertical gate trench edge by a distance of W1. As also shown in FIG. 4, the distance W1 can be less than a width W2 of a zero-bias depletion width 490 disposed in the n-type drift region 415. In other implementations. W1 and W2 can be approximately equal. The width W2 can be determined in a number of ways. For example, the width W2 can be determined using Poisson's equation. Alternatively, the width W2 can be determined using voltage contrast analysis in a scanning electron microscope.

In the MOSFET device 400 shown in FIG. 4, device turn-on and turn-off can be controlled by applying a positive, or zero bias to the gate electrode 445. For example, a positive gate bias will invert the potential of a p-body 2 region 423 that is adjacent to the vertical trench sidewall, and an n-type electron inversion channel will be formed at the interface of SiC to the gate dielectric 440. In such an arrangement, the carrier mobility in the inversion channel along the vertical sidewall is high (such as previously discussed), and the effective length of the inversion channel can be made very short by decreasing the thickness of the p-body 2 region 423 (e.g., as described above) to a thickness between 50 nm and 500 nm (which can substantially define the effective channel length of the device 400). This arrangement can reduce the on-state resistance of the inversion channel (as compared to a device without a higher Vt region as defined by the p-body 2 region 423).

In the MOSFET device 400 of FIG. 4, high voltage blocking can be facilitated by using a deep p-body region 420, which can effectively shield the vertical MOS-channel. In order to achieve desired shielding, the shielding p-body region 420 and the trench sidewall can be formed at a very short lateral width W1, as shown in FIG. 4. As noted above, the width W1 can be smaller than (or approximately equal to) the width W2 of the zero-bias depletion region 490 of the MOSFET device 400. An implanted, n-doped lateral channel portion 455 can also be formed beneath the surface of the lateral MOS-channel region, such using the approaches described herein. An n-implant in the lateral MOS-channel portion 455 can decrease a threshold voltage for the lateral portion 455 to a low number (e.g., zero volts), or can make the threshold voltage for the lateral portion 455 a negative number, e.g., make the lateral MOS-channel portion (region) 455 normally ON. Such an approach can increase the carrier mobility in the lateral channel portion 455, and, as a result, reduce the MOSFET device 400's on-state resistance (Rdson). The n-implant used to define the lateral portion 455 can also eliminate or reduce any increase of the lateral MOS-channel resistance due to proximity of the lateral channel portion 455 to the deep p-body 420.

In a general aspect, an apparatus can include a semiconductor substrate of a first conductivity type, a drift region of the first conductivity type disposed in the semiconductor substrate, a body region of a second conductivity type disposed in the drift region and a source region of the first conductivity type disposed in the body region. The apparatus can also include a gate trench disposed in the semiconductor substrate. The gate trench can have a depth that is greater than a depth of the source region and less than a depth of the body region. The apparatus can further include a gate dielectric disposed on a sidewall of the gate trench and a bottom surface of the gate trench. The gate dielectric on the sidewall of the gate trench can define a first interface with the body region and the gate dielectric on the bottom surface of the gate trench can define a second interface with the body region. The apparatus can still further include a gate electrode disposed on the gate dielectric and a lateral channel region of the first conductivity type disposed in the body region, the lateral channel region being defined along the second interface.

Implementations can include one or more of the following features. For instance, the semiconductor substrate can include a silicon carbide semiconductor substrate. The first conductivity type can be n-type and the second conductivity type can be p-type. The lateral channel region can be defined using a nitrogen ion implantation process. The lateral channel region can be further disposed along an interface between the bottom surface of the gate trench and the drift region.

The apparatus can include a sub-contact implant region of the second conductivity type disposed in the body region. The sub-contact implant region can be disposed adjacent to the source region. The source region can be disposed between the sub-contact implant region and the gate trench. The apparatus can include an ohmic contact disposed on at least a portion of the sub-contact implant region and disposed on at least a portion of the source region. The sub-contact region can be defined using an aluminum ion implantation process.

A portion of the gate dielectric can be disposed on a portion of an upper surface of the source region. A portion of the gate electrode can be disposed on the portion of the gate dielectric disposed on the upper surface of the source region.

The apparatus can include a threshold control implant of the second conductivity type disposed in the body region. The threshold control implant can be disposed below the source region and can have a depth that is less than the depth of the body region. The gate dielectric on the sidewall of the gate trench can further define an interface with the threshold control implant. A surface doping concentration of the threshold control implant can be greater than a surface doping concentration of the body region. The sidewall of the gate trench can define an angle of greater than 90 degrees with the bottom surface of the gate trench. The lateral channel region can be further disposed along at least a portion of the first interface. The lateral channel region can terminate at the threshold control implant.

The sidewall of the gate trench can define an angle of greater than 90 degrees with the bottom surface of the gate trench. The lateral channel region can be further disposed along at least a portion of the first interface.

In another general aspect, an apparatus can include a semiconductor substrate of a first conductivity type, a drift region of the first conductivity type disposed in the semiconductor substrate, a body region of a second conductivity type disposed in the drift region and a source region of the first conductivity type disposed in the body region. The apparatus can further include a threshold control implant of the second conductivity type disposed in the body region. The threshold control implant can be disposed below the source region and can have a depth that is less than a depth of the body region. The apparatus can also include a gate trench disposed in the semiconductor substrate. The gate trench can have a depth that is greater than a depth of the threshold control implant and less than a depth of the body region. The apparatus can still further include a gate dielectric disposed on a sidewall of the gate trench and a bottom surface of the gate trench. The gate dielectric on the sidewall of the trench can define an interface with the threshold control implant and a first interface with the drift region. The gate dielectric on the bottom surface of the trench can define a second interface with the drift region. The apparatus can also further include a gate electrode disposed on the gate dielectric and a lateral channel region of the first conductivity type disposed in the body region, the lateral channel region being defined along the second interface. The sidewall of the gate trench can be spaced a first distance from the body region. The first distance can be less than or equal to a second distance. The second distance can be a lateral width from a vertical edge of the body region to a vertical edge of a zero-bias depletion region of the apparatus.

Implementations can include one or more of the following features. For instance, the semiconductor substrate can include a silicon carbide semiconductor substrate. A surface doping concentration of the threshold control implant can be greater than a surface doping concentration of the body region.

The apparatus can include a sub-contact implant region of the second conductivity type disposed in the body region. The sub-contact implant region can be disposed adjacent to the source region. The source region can be disposed between the sub-contact implant region and the gate trench. The apparatus can include an ohmic contact disposed on at least a portion of the sub-contact implant region and disposed on at least a portion of the source region.

In another general aspect, an apparatus can include a silicon carbide (SiC) substrate of a first conductivity type, a drift region of the first conductivity type disposed in the SiC substrate, a body region of a second conductivity type disposed in the drift region and a source region of the first conductivity type disposed in the body region. The apparatus can also include a gate trench disposed in the SiC substrate. The gate trench can have a depth that is greater than a depth of the source region and less than a depth of the body region. The apparatus can further include a gate dielectric disposed on a sidewall of the gate trench and a bottom surface of the gate trench. The gate dielectric on the sidewall of the gate trench can define a first interface with the body region. The gate dielectric on the bottom surface of the gate trench can define a second interface with the body region. The sidewall of the gate trench can define an angle of greater than 90 degrees with the bottom surface of the gate trench. The apparatus can still also include a gate electrode disposed on the gate dielectric and a lateral channel region of the first conductivity type disposed in the body region, the lateral channel region being defined along the second interface with the body region.

Implementations can include one or more of the following features. For instance, the apparatus can include a threshold control implant of the second conductivity type disposed in the body region. The threshold control implant can be disposed below the source region and can have a depth that is less than the depth of the body region. The gate dielectric on the sidewall of the gate trench can define an interface with the threshold control implant. The lateral channel region can be disposed along at least a portion of the first interface with the body region. The lateral channel region can terminate at the threshold control implant.

The lateral channel region can be disposed along at least a portion of the first interface with the body region.

The various apparatus and techniques described herein may be implemented using various semiconductor processing and/or packaging techniques. While the devices described herein are discussed as being implemented in SiC, in some embodiments, such devices may be implemented using various types of semiconductor processing techniques associated with semiconductor substrates including, but not limited to, for example, Silicon (Si), Galium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the claims, when appended, are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus comprising:
   a silicon-carbide (SiC) substrate of a first conductivity type;
   a drift region of the first conductivity type disposed in the SiC substrate on a front side of the SiC substrate;
   a drain region disposed on a back side of the SiC substrate;
   a shielding body region of a second conductivity type disposed in the drift region;
   a source region of the first conductivity type disposed in the shielding body region;
   a gate trench disposed in the SiC substrate, the gate trench having a depth that is greater than a depth of the source region and less than a depth of the shielding body region;
   a gate dielectric disposed on a sidewall of the gate trench and a bottom surface of the gate trench, the gate dielectric on the sidewall of the gate trench defining a first interface with the shielding body region, the gate dielectric on the bottom surface of the gate trench defining a second interface with the shielding body region;
   a gate electrode disposed on the gate dielectric; and
   a lateral channel region of the first conductivity type, the lateral channel region being disposed in the shielding body region along the second interface.

2. The apparatus of claim 1, wherein the first conductivity type is n-type and the second conductivity type is p-type.

3. The apparatus of claim 1, wherein the lateral channel region includes a donor ion implant.

4. The apparatus of claim 1, further comprising:
   a sub-contact implant region of the second conductivity type disposed in the shielding body region, the sub-contact implant region being disposed adjacent to the source region, the source region being disposed between the sub-contact implant region and the gate trench; and
   a contact layer disposed on at least a portion of the sub-contact implant region and disposed on at least a portion of the source region, the contact layer establishing a first ohmic contact with the sub-contact implant region and a second ohmic contact with the source region.

5. The apparatus of claim 4, wherein the sub-contact region is includes an aluminum ion implant.

6. The apparatus of claim 1, wherein:
   a portion of the gate dielectric is disposed on a portion of an upper surface of the source region; and
   a portion of the gate electrode is disposed on the portion of the gate dielectric disposed on the upper surface of the source region.

7. The apparatus of claim 1, wherein the lateral channel region is further disposed along an interface between the bottom surface of the gate trench and the drift region.

8. The apparatus of claim 1, further comprising a threshold control region of the second conductivity type disposed in the shielding body region, the threshold control region being disposed below the source region and having a depth that is less than the depth of the shielding body region, the gate dielectric on the sidewall of the gate trench further defining an interface with the threshold control region.

9. The apparatus of claim 8, wherein a surface doping concentration of the threshold control region is greater than a surface doping concentration of the shielding body region.

10. The apparatus of claim 8, wherein:
the sidewall of the gate trench defines an angle of greater than 90 degrees with the bottom surface of the gate trench;
the lateral channel region is further disposed, in the shielding body region, along at least a portion of the first interface; and
the lateral channel region terminates at the threshold control region.

11. The apparatus of claim 1, wherein:
the sidewall of the gate trench defines an angle of greater than 90 degrees with the bottom surface of the gate trench; and
the lateral channel region is further disposed, in the shielding body region, along at least a portion of the first interface.

12. An apparatus comprising:
a silicon-carbide (SiC) substrate of a first conductivity type;
a drift region of the first conductivity type disposed in the SiC substrate on a front side of the SiC substrate;
a drain region disposed on a back side of the SiC substrate;
a shielding body region of a second conductivity type disposed in the drift region;
a source region of the first conductivity type disposed in the shielding body region;
a threshold control region of the second conductivity type disposed in the shielding body region, the threshold control region being disposed below the source region and having a depth that is less than a depth of the shielding body region;
a gate trench disposed in the SiC substrate, the gate trench having a depth that is greater than a depth of the threshold control region and less than a depth of the shielding body region;
a gate dielectric disposed on a sidewall of the gate trench and a bottom surface of the gate trench, the gate dielectric on the sidewall of the trench defining an interface with the threshold control region and a first interface with the drift region, the gate dielectric on the bottom surface of the trench defining a second interface with the drift region;
a gate electrode disposed on the gate dielectric; and
a lateral channel region of the first conductivity type, the lateral channel region being disposed in the shielding body region along the second interface,
the sidewall of the gate trench being spaced a first distance from the shielding body region, the first distance being less than or equal to a second distance, the second distance being a lateral width from a vertical edge of the shielding body region to a vertical edge of a zero-bias depletion region of the apparatus.

13. The apparatus of claim 12, wherein a surface doping concentration of the threshold control region is greater than a surface doping concentration of the shielding body region.

14. The apparatus of claim 12, further comprising:
a sub-contact implant region of the second conductivity type disposed in the shielding body region, the sub-contact implant region being disposed adjacent to the source region, the source region being disposed between the sub-contact implant region and the gate trench; and
a contact layer disposed on at least a portion of the sub-contact implant region and disposed on at least a portion of the source region, the contact layer establishing a first ohmic contact with the sub-contact implant region and a second ohmic contact with the source region.

15. An apparatus comprising:
a silicon carbide (SiC) substrate of a first conductivity type;
a drift region of the first conductivity type disposed in the SiC substrate on a front side of the SiC substrate;
a drain region disposed on a back side of the SiC substrate;
a shielding body region of a second conductivity type disposed in the drift region;
a source region of the first conductivity type disposed in the shielding body region;
a gate trench disposed in the SiC substrate, the gate trench having a depth that is greater than a depth of the source region and less than a depth of the shielding body region;
a gate dielectric disposed on a sidewall of the gate trench and a bottom surface of the gate trench, the gate dielectric on the sidewall of the gate trench defining a first interface with the shielding body region, the gate dielectric on the bottom surface of the gate trench defining a second interface with the shielding body region, the sidewall of the gate trench defining an angle of greater than 90 degrees with the bottom surface of the gate trench;
a gate electrode disposed on the gate dielectric; and
a lateral channel region of the first conductivity type, the lateral channel region being disposed in the shielding body region along the second interface.

16. The apparatus of claim 15, further comprising a threshold control region of the second conductivity type disposed in the shielding body region, the threshold control region being disposed below the source region and having a depth that is less than the depth of the shielding body region, the gate dielectric on the sidewall of the gate trench further defining an interface with the threshold control region.

17. The apparatus of claim 16, wherein:
the lateral channel region is further disposed, in the shielding body region, along at least a portion of the first interface; and
the lateral channel region terminates at the threshold control implant region.

18. The apparatus of claim 15, wherein the lateral channel region is further disposed, in the shielding body region, along at least a portion of the first interface.

19. The apparatus of claim 3, wherein the donor ion implant includes a nitrogen ion implant.

* * * * *

UNITED STATES PATENT AND TRADEMARK OFFICE
CERTIFICATE OF CORRECTION

PATENT NO. : 9,466,709 B2  
APPLICATION NO. : 14/744958  
DATED : October 11, 2016  
INVENTOR(S) : Konstantinov Page 1 of 1

It is certified that error appears in the above-identified patent and that said Letters Patent is hereby corrected as shown below:

In the Claims

In Column 14, Line 52, Claim 17, delete "control implant region." and insert -- control region. --, therefor.

Signed and Sealed this
Seventh Day of March, 2017

Michelle K. Lee
*Director of the United States Patent and Trademark Office*